(12) United States Patent
Gustafsson

(10) Patent No.: US 10,051,726 B2
(45) Date of Patent: Aug. 14, 2018

(54) USER INTERFACE ARRANGEMENT

(71) Applicant: ELECTROLUX APPLIANCES AKTIEBOLAG, Stockholm (SE)

(72) Inventor: Agne Gustafsson, Stockholm (SE)

(73) Assignee: ELECTROLUX APPLIANCES AKTIEBOLAG, Stockholm (SE)

( * ) Notice: Subject to any disclaimer, the term of this patent is extended or adjusted under 35 U.S.C. 154(b) by 156 days.

(21) Appl. No.: 15/036,177

(22) PCT Filed: Dec. 17, 2013

(86) PCT No.: PCT/EP2013/076795
§ 371 (c)(1),
(2) Date: May 12, 2016

(87) PCT Pub. No.: WO2015/090361
PCT Pub. Date: Jun. 25, 2015

(65) Prior Publication Data
US 2016/0295688 A1    Oct. 6, 2016

(51) Int. Cl.
*G01D 11/28* (2006.01)
*H05K 1/02* (2006.01)
(Continued)

(52) U.S. Cl.
CPC ....... *H05K 1/0274* (2013.01); *F21V 33/0044* (2013.01); *H03K 17/962* (2013.01);
(Continued)

(58) Field of Classification Search
CPC ............ G09F 9/33; G09F 13/04; G09F 13/22; H05K 1/0274; H05K 2201/10106;
(Continued)

(56) References Cited

U.S. PATENT DOCUMENTS 5,226,723 A   7/1993   Chen
5,239,152 A   8/1993   Chen
(Continued)

FOREIGN PATENT DOCUMENTS

DE    19649889 C1    10/1997
EP    1 355 425 A2   10/2003
(Continued)

OTHER PUBLICATIONS

International Search Report for International Application No. PCT/EP2013/076795 dated Mar. 7, 2014.

*Primary Examiner* — Thien T Mai
(74) *Attorney, Agent, or Firm* — Alston & Bird LLP

(57) ABSTRACT

A user interface arrangement may include a printed circuit board having a first surface and a second surface, and a light emitting unit. The printed circuit board may include a first non-conductive layer provided with at least one aperture. The light emitting unit may be arranged to emit light through the at least one aperture of the first non-conductive layer in a direction from the second surface to the first surface of the printed circuit board to thereby define an image visible at the first surface of the printed circuit board. Embodiments of an electric apparatus comprising a user interface arrangement, a use of a printed circuit board to provide a user interface arrangement, and a method for visualizing an image on a user interface arrangement are also provided.

12 Claims, 2 Drawing Sheets

(51) Int. Cl.
*H03K 17/96* (2006.01)
*F21V 33/00* (2006.01)

(52) U.S. Cl.
CPC .............. *H05K 2201/09072* (2013.01); *H05K 2201/10106* (2013.01); *H05K 2201/10113* (2013.01)

(58) Field of Classification Search
CPC ......... H05K 1/142; H05K 2201/09181; H05K 2201/09954; H05K 2201/10189; H05K 3/284; F21V 5/00; F21V 13/04; F21V 17/06; F21V 21/00; F21V 5/04; F21V 7/00; F21V 17/102; F21V 17/164; F21V 19/009; F21V 7/16; F21V 7/18
See application file for complete search history.

(56) References Cited

U.S. PATENT DOCUMENTS

| | | |
|---|---|---|
| 5,397,867 A | 3/1995 | Demeo |
| 5,594,222 A | 1/1997 | Caldwell |
| 5,801,345 A | 9/1998 | Mikula-Curtis et al. |
| 6,320,282 B1 | 11/2001 | Caldwell |
| 6,598,988 B1 | 7/2003 | Noll et al. |
| 6,608,617 B2 | 8/2003 | Hoffknecht et al. |
| 7,053,360 B2 | 5/2006 | Balp et al. |
| 7,175,304 B2 | 2/2007 | Wadia et al. |
| 7,705,257 B2 | 4/2010 | Arione et al. |
| 7,707,257 B2 | 4/2010 | Taieb et al. |
| 7,825,345 B1 | 11/2010 | Kano |
| 7,850,339 B2 | 12/2010 | Wadia et al. |
| 7,915,553 B2 | 3/2011 | Arione et al. |
| 7,923,654 B2 | 4/2011 | Zeijlon et al. |
| 8,462,022 B2 | 6/2013 | Roth |
| 8,807,770 B2 | 8/2014 | Didat et al. |
| 9,109,774 B1 * | 8/2015 | Winters .................. F21V 5/007 |
| 2005/0134485 A1 | 6/2005 | Hein et al. |
| 2008/0220645 A1 | 1/2008 | Skirisu et al. |
| 2010/0218565 A1 | 9/2010 | Wan et al. |
| 2011/0037624 A1 | 2/2011 | Pance et al. |
| 2011/0050626 A1 | 3/2011 | Porter et al. |
| 2013/0163272 A1 | 6/2013 | Burleson et al. |
| 2013/0194780 A1 | 8/2013 | Didat et al. |
| 2014/0160730 A1 | 6/2014 | Doering et al. |

FOREIGN PATENT DOCUMENTS

| | | | |
|---|---|---|---|
| EP | 1 595 240 A1 | 11/2005 | |
| EP | 1 696 404 A1 | 8/2006 | |
| EP | 1696404 A1 * | 8/2006 | .............. G09F 9/33 |
| EP | 2 018 703 A1 | 1/2009 | |
| EP | 2 048 781 A1 | 4/2009 | |
| EP | 2 118 878 A1 | 11/2009 | |
| EP | 2 241 799 A1 | 10/2010 | |
| EP | 2 662 981 A1 | 11/2013 | |
| FR | 2 838 558 A1 | 10/2003 | |
| GB | 1 585 392 A | 3/1981 | |
| JP | 07-015406 | 1/1995 | |
| WO | WO 2004/068448 A1 | 8/2004 | |
| WO | WO 2007/131717 A1 | 11/2007 | |
| WO | WO 2008/100320 A1 | 8/2008 | |

* cited by examiner

USER INTERFACE ARRANGEMENT

CROSS-REFERENCE TO RELATED APPLICATIONS

This application is a national stage application filed under 35 U.S.C. § 371 of International Application No. PCT/EP2013/076795 filed Dec. 17, 2013, which application is hereby incorporated by reference in its entirety.

TECHNICAL FIELD

The present invention relates to a user interface arrangement. The present invention also relates to an electric apparatus comprising a user interface arrangement, a use of a printed circuit board to provide a user interface arrangement and a method for visualizing an image on a user interface arrangement.

BACKGROUND

User interface arrangements such as display panels, and back-lit touch buttons for electric apparatuses can be used to display text, numbers and/or symbols to a user. Such display of text, numbers and/or symbols can be used to indicate a state of an apparatus comprising such an arrangement and/or may be used to indicate a position and/or function of a touch button. For competitive reasons it is an advantage if components of an apparatus are designed such that they can be manufactured at low cost. At the same time, they have to be able to fulfil certain requirements. For a user interface arrangement such as a display panel, or a back-lit touch button for an electric apparatus, such a requirement is to be able to define an image with good quality of the graphics visible at a surface of the user interface arrangement. Previous solutions often comprise thin transparent polymer films on which symbols have been printed using conventional printing techniques. Such solutions are able to define images visible at a surface with good quality of the graphics of the image. However, in relative terms, such solutions are expensive as low volume manufacturing techniques are used when manufacturing such thin transparent polymer film. Also, such solutions often require a carrier arranged to hold the plastic film, conductive ink and a specialized electrical connector which also contributes to such solutions being expensive. In the light of the above, there is a need for a user interface arrangement capable of defining an image visible at a surface and which arrangement can be manufactured at low cost.

SUMMARY

An object of the present invention is to provide a user interface arrangement capable of defining an image at a surface and which arrangement provides conditions for low cost manufacturing.

According to an aspect of the invention, the object is achieved by a user interface arrangement comprising a printed circuit board having a first surface and a second surface, and a light emitting unit, wherein the printed circuit board comprises a first non-conductive layer provided with at least one aperture and wherein the light emitting unit is arranged to emit light through the at least one aperture of the first non-conductive layer in a direction from the second surface to the first surface of said printed circuit board to thereby define an image visible at the first surface of said printed circuit board. According to such embodiments, since the user interface comprises a printed circuit board and an image is defined visible at the first surface of said printed circuit board, a user interface arrangement is provided capable of defining an image at a surface. Since the user interface comprises a printed circuit board, conditions are provided for low cost manufacturing.

As a result, the above mentioned object is achieved.

Also, due to the user interface comprising a printed circuit board, high volume manufacturing techniques can be used in the manufacturing of the user interface.

Also, due to the user interface comprising a printed circuit board, additional components can easily be mounted onto the user interface arrangement.

Also, due to the user interface comprising a printed circuit board, wiring to the light emitting unit and other additional components can be provided in an easy manner at a low cost.

According to some embodiments, the first non-conductive layer is provided on said first surface of said printed circuit board. According to such embodiments, since the first non-conductive layer is provided on said first surface of said printed circuit board, a good quality of the image defined at the first surface of said printed circuit board is provided.

According to some embodiments, the first non-conductive layer is a solder mask layer. According to such embodiments, since the first non-conductive layer is a solder mask layer, a low cost component is used to provide the user interface. Also, high volume manufacturing techniques can be used in the manufacturing of the user interface.

According to some embodiments, the printed circuit board further comprises a second non-conductive layer and a light diffuser layer arranged between the first non-conductive layer and the second non-conductive layer and wherein said second non-conductive layer is provided with at least one aperture arranged substantially in a position corresponding to a position of the at least one aperture of the first non-conductive layer on the printed circuit board to admit light being emitted through the printed circuit board in a direction from the second surface to the first surface of said printed circuit board via the at least one aperture of the second non-conductive layer and the at least one aperture of the first non-conductive layer. According to such embodiments, since the printed circuit board further comprises a second non-conductive layer and a light diffuser layer arranged between the first non-conductive layer and the second non-conductive layer, a thickness of the first non-conductive layer can be reduced. As a result, the quality of the graphics of the image visible at the first surface can be improved.

According to some embodiments, the size and the shape of said at least one aperture of the second non-conductive layer substantially corresponds to the size and shape of the at least one aperture of said first non-conductive layer. According to such embodiments, since size and the shape of said at least one aperture of the second non-conductive layer substantially corresponds to the size and shape of the at least one aperture of said first non-conductive layer, the quality of the graphics of the image can be improved.

According to some embodiments, the second non-conductive layer is a solder mask layer. According to such embodiments, since the second non-conductive layer is a solder mask layer, low cost components are used to provide the user interface. Also, high volume manufacturing techniques can be used in the manufacturing of the user interface.

According to some embodiments, the printed circuit board further comprises a touch sensing electrode layer configured to detect presence of a touch event. According to such embodiments, since the printed circuit board further comprises a touch sensing electrode layer configured to detect presence of a touch event, a user interface arrangement is provided capable of detecting presence of a touch event where the user interface arrangement is provided by using low cost components. Further, since the user interface arrangement comprises a printed circuit board, such touch sensing electrode layer can be implemented in an easy manner at a low cost.

According to some embodiments, the printed circuit board further comprises a ground plate layer. Electrical noise may cause issue with the detection of a touch event. According to such embodiments, since the printed circuit board further comprises a ground plate layer, such electrical noise can be reduced. As a result, detection of the presence of a touch event can be improved.

According to some embodiments, the second surface of the printed circuit board comprises a reflective layer. According to such embodiments, since the second surface of the printed circuit board comprises a reflective layer, the amount of light the first and/or second non-conductive layer is subjected to is reduced. Thereby, a thickness of these layers can be reduced and the quality of the graphics of the image defined at the first surface can be improved. Also, according to such embodiments, since the second surface of the printed circuit board comprises a reflective layer, light being emitted by the light emitting unit can be reflected on a surface of another component towards the at least one aperture of the first non-conductive layer to thereby define an image visible at the first surface of said printed circuit board. Thereby, quality of the graphics of the image defined at the first surface can be improved and a power of the light emitting unit can be reduced.

According to some embodiments, the reflective layer is a silk screen layer. According to such embodiments, since the reflective layer is a silk screen layer, low cost components are used to provide the user interface. Also, high volume manufacturing techniques can be used in the manufacturing of the user interface.

According to an aspect of the invention, the object is achieved by an electric apparatus where said electric apparatus comprises a user interface arrangement according to some embodiments. Since the electric apparatus comprises a user interface arrangement according to some embodiments, the user interface arrangement will be capable of defining an image at a surface and the arrangement provides conditions for low cost manufacturing.

As a result, the above mentioned object is achieved.

According to an aspect of the invention, the object is achieved by a use of a printed circuit board according to some embodiments to provide a user interface arrangement. According to such embodiments, since a printed circuit board according to some embodiments is used to provide a user interface arrangement, the user interface arrangement will be capable of defining an image at a surface and the arrangement provides conditions for low cost manufacturing.

As a result, the above mentioned object is achieved.

According to an aspect of the invention, the object is achieved by a method for visualizing an image on a user interface arrangement, said method comprising the steps of;

providing a user interface arrangement, said user interface arrangement comprising a printed circuit board having a first surface and a second surface and a light emitting unit, said printed circuit board comprising a first non-conductive layer provided with at least one aperture; and emitting light through said at least one aperture of the first non-conductive layer in a direction from the second surface to the first surface of said printed circuit board, whereby an image is visualized at the first surface of said printed circuit board.

Since the method comprises emitting light through the at least one aperture of the first non-conductive layer in a direction from the second surface to the first surface of the printed circuit board, whereby an image is visualized at the first surface of the printed circuit board, a method for visualizing an image on a user interface arrangement is provided capable of defining an image at a surface and which arrangement provides conditions for low cost manufacturing.

As a result, the above mentioned object is achieved.

Further features of, and advantages with, the present invention will become apparent when studying the appended claims and the following detailed description. Those skilled in the art will realize that the different features described may be combined to create embodiments other than those described in the following, without departing from the scope of the present invention, as defined by the appended claims.

BRIEF DESCRIPTION OF THE DRAWINGS

The various aspects of the invention, including its particular features and advantages, will be readily understood from the following detailed description and the accompanying drawings, in which.

DETAILED DESCRIPTION

The embodiments herein will now be described more fully with reference to the accompanying drawings, in which embodiments are shown. Disclosed features of the embodiments may be combined as readily understood by one of ordinary skill in the art. Like numbers refer to like elements throughout.

Well-known functions or constructions will not necessarily be described in detail for brevity and/or clarity.

Figure 1:
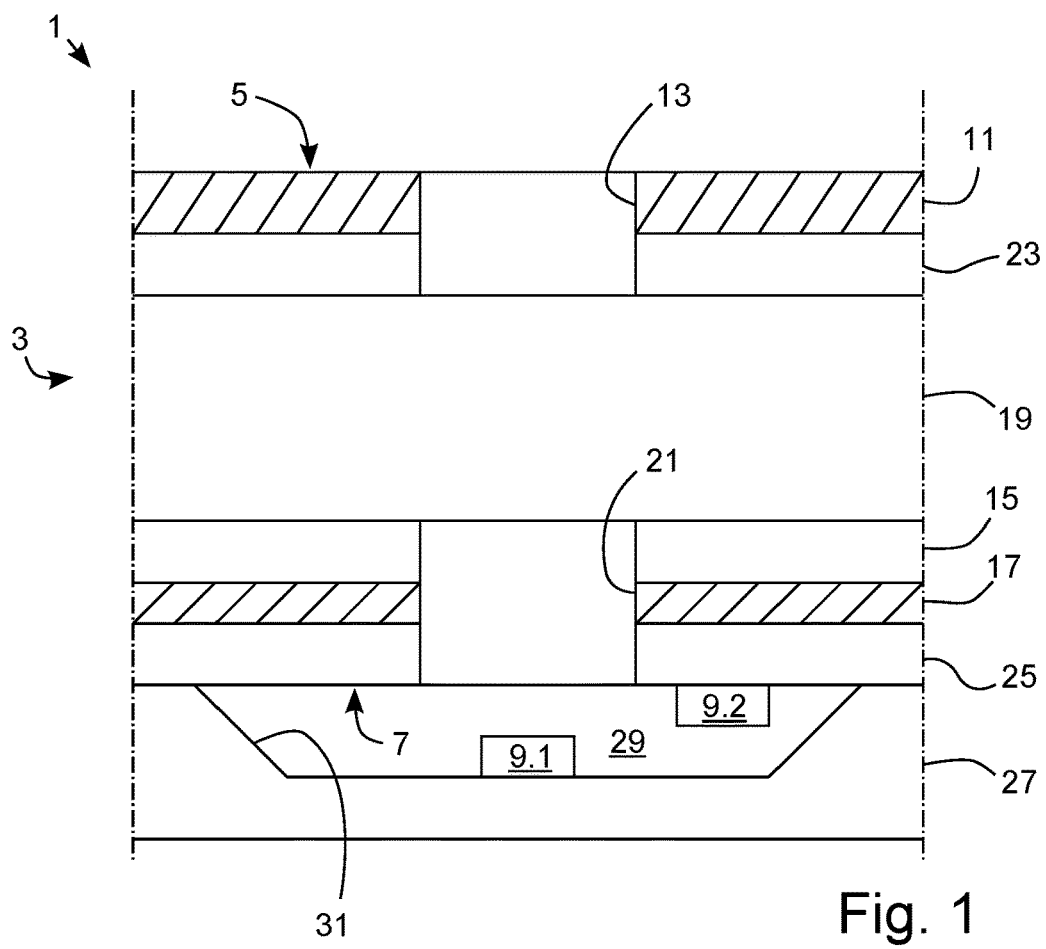
FIG. 1 illustrates a cross-section of a user interface arrangement 1.

FIG. 1 illustrates a cross-section of a user interface arrangement 1 according to some embodiments. The user interface arrangement 1 comprises a printed circuit board 3 having a first surface 5 and a second surface 7, and a light emitting unit 9.1, 9.2. The printed circuit board 3 comprises a first non-conductive layer 11 provided with at least one aperture 13. The light emitting unit 9.1, 9.2 is arranged to emit light through the at least one aperture 13 of the first non-conductive layer 11 in a direction from the second surface 7 to the first surface 5 of the printed circuit board 3 to thereby define an image visible at the first surface 5 of the printed circuit board 3. Since the image is visualized on the first surface 5 of the printed circuit board 3, the first surface 5 of the printed circuit board 3 defines the user interface of the user interface arrangement 1.

The user interface arrangement 1 may be a user interface arrangement for an electric apparatus such as a display panel or a back-lit touch button display which can be configured to display text, numbers and/or symbols to a user. Such display of text, numbers and/or symbols can be used to indicate a state of an apparatus comprising such an arrangement and/or may be used to indicate a position and/or function of a touch button.

The light emitting unit 9.1, 9.2 may comprise a light bulb or a Light Emitting Diode (LED). As illustrated in FIG. 1, the light emitting unit 9.2 may be arranged on the printed circuit board 3. Since the user interface arrangement 1 comprises a printed circuit board 3, the light emitting unit 9.2 can easily be mounted onto the printed circuit board 3 and the wiring to such a light emitting unit 9.2 can easily be provided at a low cost.

The user interface arrangement 1 may further comprise a screen 27. The screen 27 may define an enclosure 29 enclosing the light emitting unit 9.1, 9.2. The screen 27 may comprise an inner surface 31 provided with a reflective surface arranged to reflect light emitted by the light emitting unit 9.1, 9.2. Thus, in embodiments where the light emitting unit 9.2 is arranged on the printed circuit board 3, the light emitting unit 9.2 is arranged to emit light towards the inner surface 31 of the screen 27 such that light is reflected towards the at least one aperture 13 of the first non-conductive layer 11. The reflective surface may comprise paint in a bright colour or a metallic coating. The screen 27 may be formed by fiberglass.

The first non-conductive layer 11 may be provided on the first surface 5 of the printed circuit board 3. By the first non-conductive layer 11 being provided on the first surface 5 of the printed circuit board 3, quality of the graphics of the image defined at the first surface 5 of the printed circuit board 3 may be improved.

The first non-conductive layer 11 may be a solder mask layer. A solder mask layer is a layer normally being used to reduce the risk of solder bridging while soldering components onto a printed circuit board. Applying a solder mask layer onto a printed circuit board is a well-known procedure and high volume manufacturing techniques have been developed for the purpose. Therefore, in embodiments wherein the first non-conductive layer 11 is a solder mask layer, high volume manufacturing techniques can be used in the manufacturing of the user interface arrangement 1. As a result, manufacturing costs of the user interface arrangement 1 is reduced.

The printed circuit board 3 may further comprise a light diffuser layer 19. The light diffuser layer 19 is provided in a transparent or semi-transparent material. Such transparent or semi-transparent material may comprise fiberglass. The printed circuit board 3 may further comprise a second non-conductive layer 17 where the light diffuser layer 19 is arranged between the first non-conductive layer 11 and the second non-conductive layer 17. The second non-conductive layer 11 may also be a solder mask layer. Such a second non-conductive layer 17 is also provided with at least one aperture 21 arranged substantially in a position corresponding to a position of the at least one aperture 13 of the first non-conductive layer 11 on the printed circuit board 3. Thereby, light can be emitted through the printed circuit board 3 in a direction from the second surface 7 to the first surface 5 of the printed circuit board 3 via the at least one aperture 21 of the second non-conductive layer 17 and the at least one aperture 13 of the first non-conductive layer 11. Studies have shown that graphics of the image visible at the first surface 5 is improved by using a thin first non-conductive layer 11 while a thick first non-conductive layer 11 is more effective as a light mask. By the printed circuit board 3 further comprising a second non-conductive layer 17, a thickness of the first non-conducting layer 11 can be reduced. Accordingly, as a result, due to the printed circuit board 3 further comprising a second non-conductive layer 17, quality of the graphics of the image visible at the first surface 5 can be improved.

Further, according to some embodiments, a solder mask layer is applied to one or more free ends of the light diffuser layer 19 to thereby block light from passing such one or more of free ends of the light diffuser layer 19. Thereby, light is prevented from entering or exiting such one or more of free ends of the light diffuser layer 19.

Also, the light diffuser layer 19 may be arranged such that it changes the colour of light being emitted by the light emitting unit 9.1, 9.2. Further, by choosing a thickness of the light diffuser layer 19, an intensity of the light defining the image visible at the first surface can be varied.

In embodiments wherein the printed circuit board 3 comprises a second non-conductive layer 17, the size and the shape of the at least one aperture 21 of the second non-conductive layer 17 may substantially corresponds to the size and shape of the at least one aperture 13 of the first non-conductive layer 11.

Figure 2:
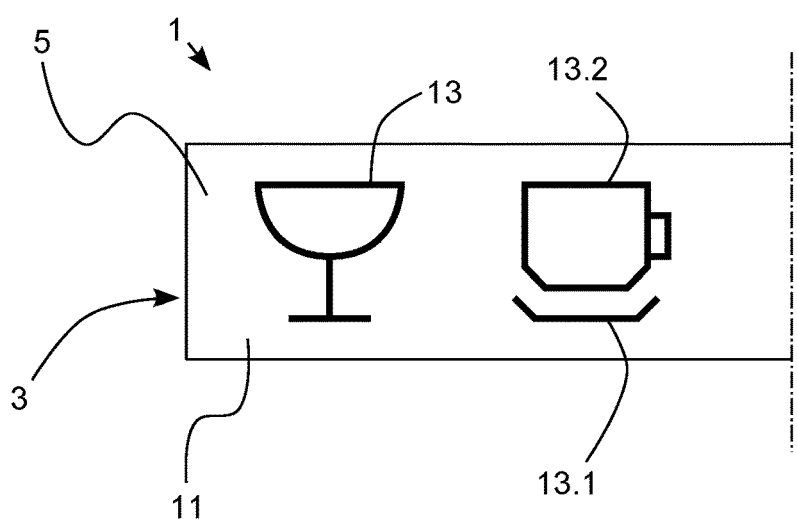
FIG. 2 illustrates the user interface arrangement 1 illustrated in FIG. 1 with the first surface 5 facing towards a viewer.

FIG. 2 illustrates the user interface arrangement 1 illustrated in FIG. 1 with the first surface 5 facing towards a viewer of the figure. The at least one aperture 13 of the first non-conductive layer 11 on the printed circuit board 3 is provided in the form of a wine glass symbol. Such a wine glass symbol may indicate the presence of a touch button with the function of starting a light wash of dishes. The size and the shape of the at least one aperture of the second non-conductive layer (not shown) may substantially corresponds to the size and shape of the at least one aperture 13 of the first non-conductive layer 11. Thus, in the embodiment shown in FIG. 2, such size and shape would substantially correspond to the size and shape of the wine glass symbol provided by the at least one aperture 13 of the first non-conductive layer 11. Also, according to some embodiments, the size and the shape of the at least one aperture 21 of the second non-conductive layer 17 may be slightly larger than the size and shape of the at least one aperture 13 of the first non-conductive layer 11. Thereby, more light is emitted through the at least one aperture 21 of the second non-conductive layer 17 than the at least one aperture 13 of the first non-conductive layer 11. As a result, quality of the graphics of the image visible at the first surface 5 can be improved.

In FIG. 2, two adjacent buttons are illustrated, a button to the left showing a wine glass symbol and a button to the right showing a coffee cup symbol. The coffee cup symbol is provided by the first non-conductive layer 11 comprising two apertures 13.1, 13.2 which together form the coffee cup symbol. Such a coffee cup symbol may indicate the presence of a touch button with the function of starting a medium wash of dishes.

Due to the user interface arrangement 1 comprising a printed circuit board 3 comprising a first non-conductive layer 11 provided with at least one aperture 13, 13.1, 13.2 and where an image is defined by a light emitting unit 9.1, 9.2 being arranged to emit light through the at least one aperture 13, 13.1, 13.2, a variety of conceivable symbols or images can be provided, simply by arranging one or more apertures in the first non-conductive layer 11 in a particular shape or pattern. For example, a user interface arrangement 1 can be provided comprising a first non-conductive layer 11 provided with seven apertures together forming a seven-segment display. Such a user interface arrangement may comprise seven light emitting units, one for each aperture.

Thereby, a user interface arrangement is provided capable of displaying numbers between 0-9. Further, a user interface arrangement 1 can be provided comprising a first non-conductive layer 11 provided with a plurality of apertures each being provided with a light emitting unit, such that a user interface arrangement is provided capable of displaying commonly used letters or symbols.

The two adjacent buttons illustrated in FIG. 2 may each comprise a light emitting unit (not shown). When one of the two buttons is illuminated by a light emitting unit, some light may propagate through the light diffuser layer to the adjacent button. This phenomenon can be called over shine. Studies have shown that such over shine is reduced by using two non-conducting layers. Accordingly, in embodiments where the printed circuit board 3 comprises a first non-conduction layer 11 and a second non-conduction layer 17, such over shine can be reduced. Also, studies have shown that such over shine is reduced by providing the size and the shape of the at least one aperture 21 of the second non-conductive layer 17 such that it substantially corresponds to the size and shape of the at least one aperture 13 of the first non-conductive layer 11. Therefore, in such embodiments described above, over shine can be reduced.

As illustrated in FIG. 1, the printed circuit board 3 may further comprise a touch sensing electrode layer 15 configured to detect presence of a touch event. The touch sensing electrode layer 15 may be a capacitor type sensing electrode layer 15. The touch sensing electrode layer 15 may comprise a copper layer. According to some embodiments, the printed circuit board 3 comprises two or more touch sensing electrode layers. Since the user interface arrangement comprises a printed circuit board 3, a touch sensing electrode layer 15 can be implemented in an easy manner at a low cost. Also, as illustrated in FIG. 1, the touch sensing electrode layer 15 may be provided between the light diffuser layer 19 and the second non-conductive layer 17. Studies have shown that such a placement of the touch sensing electrode layer 15 have less impact on quality of the graphics of the image visible at the first surface 5 than placements closer to the first non-conductive layer 11.

The user interface arrangement 1 may further comprise one or more processing units and may comprise one or more memory units connected thereto. Such one or more processing units may be configured to selectively turn on or off one or more light emitting units comprised in the arrangement 1. Also, such one or more processing units may be connected to the touch sensing electrode layer 15 to thereby detect presence of a touch event. Since the user interface arrangement 1 comprises a printed circuit board 3, implementation of such one or more processing units, one or more memory units and required wiring can be implemented in a simple manner at a low cost.

As illustrated in FIG. 1, the printed circuit board 3 may further comprise a ground plate layer 23. Electrical noise may cause issue with the detection of a touch event. In embodiments wherein the printed circuit board 3 further a ground plate layer 23, such electrical noise can be reduced. As a result, detection of the presence of a touch event can be improved. In FIG. 2, two adjacent buttons are illustrated, a button to the left showing a wine glass symbol and a button to the right showing a coffee cup. In embodiments where the printed circuit board 3 comprises a ground plate layer 23, such a ground plate layer 23 may facilitate detection of a touch event with the touch sensing electrode layer 15. Also, due to such a ground plate layer 23, one or more processing units connected to the touch sensing electrode layer 15 may more easily detect a position of a touch event on the user interface arrangement 1 such that the risk of an erroneous detection of a touch event is reduced.

As illustrated in FIG. 1, the second surface 7 of the printed circuit board 3 may comprise a reflective layer 25. Such a reflective layer 25 may reduce the amount of light the first and/or second non-conductive layer 11, 17 is subjected to. Thereby, a thickness of the first and/or second non-conductive layer 11, 17 can be reduced with unaffected quality of the graphics of the image defined at the first surface 5. Also, due to such a reflective layer 25, light being emitted by the light emitting unit 9.1, 9.2 can be emitted to a surface of another component, e.g. an inner surface 31 of a screen 27, where it can be reflected in a direction towards the at least one aperture 13 of the first non-conductive layer 11 to thereby define an image visible at the first surface 5 of the printed circuit board 3. Thereby, quality of the graphics of the image defined at the first surface 5 can be improved and a power of the light emitting unit 9.1, 9.2 can be reduced.

The reflective layer 25 may be a silk screen layer. Such a silk screen layer may be provided in a bright colour, for example in the colour white. Applying a silk screen layer onto a printed circuit board is a commonly known procedure and high volume manufacturing techniques have been developed for the purpose. Therefore, in embodiments wherein the second surface 7 of the printed circuit board 3 comprises a reflective layer 25 in the form of a silk screen layer, high volume manufacturing techniques can be used in the manufacturing of the user interface arrangement 1. As a result, manufacturing costs of the user interface arrangement 1 can be reduced.

Each one of the touch sensing electrode layer 15, the ground plate layer 23, and the reflective layer 25 is provided with at least one aperture arranged substantially in a position corresponding to a position of the at least one aperture 13 of the first non-conductive layer 11 on the printed circuit board 3. The size and the shape of such a at least one aperture of the touch sensing electrode layer 15, the ground plate layer 23, and the reflective layer 25 can at least substantially correspond to the size and shape of the at least one aperture 13 of the first non-conductive layer 11. Thus, in these embodiments, the at least one aperture of the touch sensing electrode layer 15, the ground plate layer 23, and the reflective layer 25 are arranged such that light that is emitted in a straight angle towards the second surface 7 is emitted through the at least one aperture 13 of the first non-conducting layer 11 without being disturbed by the touch sensing electrode layer 15, the ground plate layer 23, and the reflective layer 25.

Further, according to some embodiments, in order to achieve the same effect, the at least one aperture of one or more of the touch sensing electrode layer 15, the ground plate layer 23, and/or the reflective layer 2 may be made considerable larger than the at least one aperture 13 of the first non-conductive layer 11.

Figure 3:
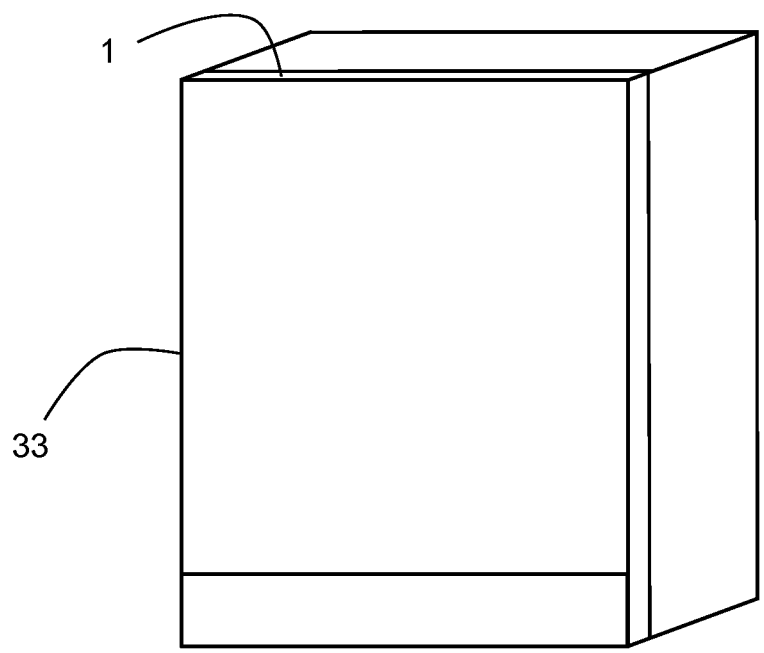
FIG. 3 illustrates an electric apparatus 33 comprising a user interface arrangement 1.

FIG. 3 illustrates an electric apparatus 33 comprising a user interface arrangement 1 according to some embodiments. For example, such an electric apparatus 33 may be a house hold appliance. The electric apparatus 33 illustrated in FIG. 3 is a dishwasher. However, an electric apparatus 33 comprising a user interface arrangement 1 according to some embodiments may be an electric household apparatus such as a vacuum cleaner, a coffee machine, a smoothing iron, a food processor, a food mixer, a hand blender, or the like. Also, an electric apparatus 33 comprising a user interface arrangement 1 according to some embodiments may be an oven, a microwave oven, a stove, a washing machine, a tumble dryer, a refrigerator, a heat pump apparatus, a kitchen fan or the like.

Figure 4:
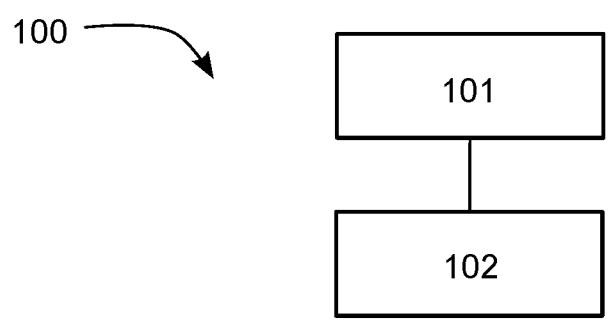
FIG. 4 illustrates a method for visualizing an image on a user interface arrangement.

FIG. 4 illustrates a method 100 for visualizing an image on a user interface arrangement, the method 100 comprising the steps of;
- 101 providing a user interface arrangement, the user interface arrangement comprising a printed circuit board having a first surface and a second surface and a light emitting unit, the printed circuit board comprising a first non-conductive layer provided with at least one aperture; and
- 102 emitting light through the at least one aperture of the first non-conductive layer in a direction from the second surface to the first surface of the printed circuit board, whereby an image is visualized at the first surface of the printed circuit board.

The invention claimed is:

1. A user interface arrangement comprising;
a printed circuit board having a first surface and a second surface, and
a light emitting unit,
wherein (a) the printed circuit board comprises (i) a first non-conductive layer provided with at least one aperture, (ii) a second non-conductive layer, and (iii) a light diffuser layer arranged between the first non-conductive layer and the second non-conductive layer and (b) said second non-conductive layer is provided with at least one aperture arranged substantially in a position corresponding to a position of the at least one aperture of the first non-conductive layer on the printed circuit board, (c) the size and the shape of said at least one aperture of the second non-conductive layer substantially corresponds to the size and the shape of the at least one aperture of said first non-conductive layer, and (d) the light emitting unit is arranged to emit light through the at least one aperture of the first non-conductive layer and the at least one aperture of the second non-conductive layer in a direction from the second surface to the first surface of said printed circuit board to thereby define an image visible at the first surface of said printed circuit board.

2. The user interface arrangement according to claim 1 wherein the first non-conductive layer is provided on said first surface of said printed circuit board.

3. The user interface arrangement according to claim 1, wherein the first non-conductive layer is a solder mask layer.

4. The user interface arrangement according to claim 1, wherein the second non-conductive layer is a solder mask layer.

5. The user interface arrangement according to claim 1, wherein the printed circuit board further comprises a touch sensing electrode layer configured to detect presence of a touch event.

6. The user interface arrangement according to claim 5 wherein the printed circuit board further comprises a ground plate layer.

7. The user interface arrangement according to claim 1, wherein the second surface of the printed circuit board comprises a reflective layer.

8. The user interface arrangement according to claim 7, wherein the reflective layer is a silk screen layer.

9. An electric apparatus comprising a user interface arrangement according to claim 1.

10. The electric apparatus according to claim 9 wherein said electric apparatus is a dishwasher.

11. A printed circuit board for use as a user interface arrangement, the printed circuit board comprising:
a first surface;
a second surface;
a first non-conductive layer provided with at least one first aperture;
a second non-conductive layer provided with at least one second aperture;
a light diffuser layer arranged between the first non-conductive layer and the second non-conductive layer; and
a light emitting unit;
wherein (a) the at least one second aperture is arranged substantially in a position corresponding to a position of the at least one first aperture on the printed circuit board, (b) the size and the shape of the at least one second aperture substantially corresponds to the size and the shape of the at least one first aperture, and (c) the light emitting unit is arranged to emit light through the at least one first aperture and the at least one second aperture in a direction from the second surface to the first surface of the printed circuit board to thereby define an image visible at the first surface of said printed circuit board.

12. A method for visualizing an image on a user interface arrangement, said method comprising the steps of;
providing a user interface arrangement, said user interface arrangement comprising a printed circuit board having a first surface and a second surface and a light emitting unit,
said printed circuit board comprising a first non-conductive layer provided with at least one aperture and a second non-conductive layer provided with at least one aperture, and a light diffuser layer arranged between the first non-conductive layer and the second non-conductive layer, wherein the size and the shape of the at least one aperture of the second non-conductive layer substantially corresponds to the size and the shape of the aperture of the first non-conductive layer; and
emitting light through said at least one aperture of the first non-conductive layer in a direction from the second surface to the first surface of said printed circuit board, whereby an image is visualized at the first surface of said printed circuit board.

* * * * *